US005749975A

United States Patent [19]

Li et al.

[11] Patent Number: 5,749,975
[45] Date of Patent: May 12, 1998

[54] PROCESS FOR DRY CLEANING WAFER SURFACES USING A SURFACE DIFFUSION LAYER

[75] Inventors: Li Li, Meridian; Richard C. Hawthorne, Nampa, both of Id.

[73] Assignee: Micron Technology, Inc., Boise, Id.

[21] Appl. No.: 579,943

[22] Filed: Dec. 28, 1995

[51] Int. Cl.$^6$ ........................................................ B08B 7/00
[52] U.S. Cl. ........................... 134/1.3; 134/1; 134/2; 134/26; 134/30
[58] Field of Search ...................... 134/2, 1, 1.1, 1.2, 134/1.3, 26, 28, 32, 30

[56] References Cited

U.S. PATENT DOCUMENTS

| 4,871,417 | 10/1989 | Nishizawa et al. ........................... 134/1 |
| 5,078,832 | 1/1992 | Tanaka ........................................ 134/1 |
| 5,225,355 | 7/1993 | Sugino et al. . | |

OTHER PUBLICATIONS

Handbook of Semiconductor Wafer Cleaning Technology, Editor Werner Kern, Noyes Publications, 1993 pp. 25–29 and 52–67.

Sugino et al. Ultraviolet Exited Cl–radical Etching of Si through Native Oxide. J. Appl. Phys., vol. 76, No. 9, pp. 5498–5502, Nov. 1994.

Primary Examiner—Jill Warden
Assistant Examiner—Alexander Markoff
Attorney, Agent, or Firm—Workman, Nydegger & Seeley

[57] ABSTRACT

Disclosed is a method for dry cleaning a silicon surface on an in-process integrated circuit wafer which can be conducted in situ in a cluster tool or a reaction chamber where a previous etch or oxide removal step is conducted. The first step in the method is providing a silicon surface on the wafer which is to be cleaned of contaminates. Next, the wafer is located in a reaction chamber where the etch or oxide removal step is conducted. An adsorbent surface diffusion layer typically comprising a thin water or solvent layer in liquid state is then adhered to the silicon surface in the reaction chamber. Finally, the silicon surface is exposed to ultraviolet radiation and at least one gaseous cleaning agent while the surface diffusion layer is adhered on the silicon surface. A clean silicon surface results which does not exhibit the surface roughness typical of conventional dry cleaning processes.

17 Claims, No Drawings

PROCESS FOR DRY CLEANING WAFER SURFACES USING A SURFACE DIFFUSION LAYER

BACKGROUND OF THE INVENTION

1. The Field of the Invention

The present invention relates to the cleaning of contaminates from wafer surfaces. More particularly, the present invention relates to a method of dry cleaning contaminates such as metals, oxides, and organic particulate matter from silicon surfaces on in-process integrated circuit wafers using a surface diffusion layer to substantially eliminate surface roughness.

2. The Relevant Technology

In the rapidly advancing field of integrated circuit technology, the performance of integrated circuits is being constantly enhanced, and the manufacturing process is becoming increasingly streamlined. One critical portion of the manufacturing process that is rapidly evolving is etching. Etching is a technique whereby openings and geometries are formed in thin films on in-process integrated circuit wafers. The films typically comprise materials such as oxides, polysilicon, or aluminum.

As a result of the etching step, residues, typically organic materials, are left behind on the film and must be removed. Thus, a cleaning procedure attendant to the etching step is also necessary.

A further procedure frequently conducted in the integrated circuit manufacturing process is the removal of native oxide layers and intentionally deposited sacrificial oxide layers. The oxide removal process also leaves behind residue that must be cleaned from the wafer.

Residues and other contaminants have traditionally been cleaned from silicon surfaces of wafers using one of several different processes. Each of these processes has attendant disadvantages. One of the processes utilized by the prior art is the wet clean. Wet cleaning consists of immersing the wafer in an appropriate liquid solution, or spraying the wafer with a liquid solution. This is typically accompanied by agitation, and in the case of particle removal, scrubbing with a special brush or with sonic power. Variations on the wet clean are the RCA clean and the piranha clean. The RCA clean uses an acidic mixture which is used to remove alkali ions and cations as well as metallic contaminants. The piranha clean uses an aggressive mixture of sulfuric acid and $H_2O_2$ along with other oxidizing agents and is very effective in attacking organic materials.

One of the drawbacks of wet cleaning is that surface tension can prevent the liquid from penetrating into high aspect ratio features, leaving part of the surface uncleaned. A further concern of wet cleaning is the high cost involved with the use and disposal of the large quantities of liquid chemicals that are necessary. Furthermore, disposal of the large amounts of waste produced by wafer cleaning facilities is also very costly. Consequently, substantial savings and environmental benefits are achieved by replacing conventional wet cleaning with gas phase or dry cleaning processes.

Another disadvantage with wet cleaning is its incompatibility with tool clustering. Tool clustering is one recent advance in the field of integrated circuit manufacturing and involves the integration of several consecutive operations within the same closed chamber without, for example, interrupting the vacuum within the closed chamber and exposing the contents to an ambient atmosphere. Tool clustering greatly increases the throughput of the manufacturing process.

Dry cleaning processes are highly favorable in that they can be conducted within a cluster tool. Thus, one example of tool clustering is to combine into one unit an in situ dry cleaning module with a gate-oxide growth module and a polysilicon deposition module. Dry cleaning in a cluster tool results in a high degree of contamination control.

Dry cleaning processes fall into several categories, including momentum transfer and gas phase processes based on thermal, plasma, and photo-excited reactions. Of particular effectiveness, however, is the photo-enhanced dry cleaning method. Photo enhanced dry cleaning is used to remove impurities from the wafer surface by exposing the wafer to ultraviolet radiation in the presence of oxygen. In one such system, a low pressure mercury vapor lamp emits a spectrum which contains light of wavelengths of 184.9 nanometers and 253.7 nanometers. Oxygen absorbs 184.9 nanometer radiation to form very active ozone. Ozone disassociates by absorbing 253.7 nanometers radiation. When both wavelengths are present, ozone continuously forms and disassociates. An intermediate product from both the formation and disassociation of ozone is atomic oxygen which is a very strong oxidizing agent. Ozone effectively oxidizes and volatilizes carbon and organic compounds, but is not effective in removing inorganic materials and metals.

Removal of metallic impurities from a surface of a wafer can be achieved by exposing the surface of the wafer to UV radiation in a halogen ambient such as in $Cl_2$ or HCL. Irradiation of gases with UV produces reactive halogen-radicals in the gas-phase or on the wafer surface. These react with trace metals to form volatile halogen compounds. In the case of $Cl_2$, light etching of silicon occurs as the chlorine radicals react with silicon to form volatile silicon-chloride compounds, resulting in spontaneous etching of silicon and lifting off of the metal contaminants. Thus, photo enhanced dry cleaning effectively cleans silicon surfaces of in-process integrated circuits of many impurities, and works particularly well with tool clustering.

One detrimental side effect resulting from photo-enhanced dry cleaning processes, however, is that the silicon surface is roughened as a result of the process. This is due to the active ingredients in the HCl or other chlorine or fluorine species, referred to as the reaction species. Since the reaction species has a very long mean free path in the gas phase, this form of cleaning roughens the surface. Thus, the silicon surface is pitted and scored as a result. This is highly undesirable, as a second layer is typically formed on the silicon surface, often comprising a gate oxide such as $SiO_2$. The surface roughness translates into interfacial roughness at the silicon surface and second layer interface, resulting in high leakage currents or early dielectric breakdown when the second layer is a gate oxide dielectric interfacing with silicon surface.

Thus, a need exists in the art for a method of effectively cleaning a silicon surface on an in-process integrated circuit wafer. Such a method would be particularly advantageous if the wafer could be subjected to a dry cleaning process in a closed chamber wherein a preceding etch or oxide removal step previously occurs without substantially roughening the silicon surface.

SUMMARY AND OBJECTS OF THE INVENTION

The present invention seeks to resolve the above and other problems that have been experienced in the art. More particularly, the present invention constitutes an advancement in the art by providing a method for cleaning silicon surfaces on wafers which achieves each of the objects listed below.

It is an object of the present invention to provide a method for cleaning silicon surfaces on in-process integrated circuit wafers which can be effectively conducted with current in situ dry cleaning processes in a cluster tool.

It is also an object of the present invention to provide such a method which is capable of effectively cleaning metals, oxides, and organic materials from the film surface.

It is further an object of the present invention to provide such a method which results in reduced roughness of the cleaned silicon surface.

To achieve the foregoing objects, and in accordance with the invention as embodied and broadly described herein in the preferred embodiment, a method is provided for eliminating surface roughness due to dry cleaning processes of a silicon surface on an in-process integrated circuit wafer through the use of a surface diffusion layer. The first step of the method of the present invention comprises forming a silicon surface on the wafer. Afterwards, a process is conducted upon the silicon surface which necessitates a cleaning procedure. This typically comprises etching the silicon surface, or the removal of a material such as a sacrificial or native oxide layer, and is conducted in an anticorrosive reaction chamber.

As a result of the etching or silicon surface removal step, surface contaminates typically remain on the surface of the silicon surface. A cleaning process is then conducted under the present invention in order to remove these contaminates. In order to reduce surface roughening of the cleaning process, an adsorbent diffusion layer is first adhered to the silicon surface. The adsorbent surface diffusion layer preferably comprises water or solvent in a liquid state. The adsorbent diffusion layer is preferably adhered by the process of adsorption or surface condensation.

The dry cleaning process is then conducted, typically utilizing UV radiation in an atmosphere of a cleaning agent which can comprise HCl, Cl$_2$ or other effective cleaning materials. The dry cleaning process is preferably performed in the reaction chamber where the prior etch or material removal was conducted, although a separate chamber, tool or vessel could also be used. The dry cleaning process effectively removes the contaminates, while the surface diffusion layer reduces the mean free path of the reactive species of the cleaning agent. This in turn reduces the surface roughness of the silicon surface, allowing any further layers which may be grown or deposited thereon to properly adhere, thereby resulting in increased performance of the integrated circuit being formed.

Thus, the present invention provides a method of dry cleaning a silicon surface on an in-process integrated circuit wafer in situ in the reaction chamber or cluster tool where the preceding etch or material removal was conducted. The method of the present invention results in effective cleaning of the silicon surface to prepare the silicon surface for further procedures and achieves this result without substantially roughening the silicon surface.

DETAILED DESCRIPTION OF THE PREFERRED EMBODIMENTS

The present invention is based upon the principle that reducing the mean free path of a cleaning agent in a dry cleaning process results in a silicon surface on a wafer which is to be cleaned exhibiting a substantially reduced surface roughness. Attendant to this principle is the discovery by the inventors that forming a surface diffusion layer on the silicon surface reduces the mean free path of the cleaning agent and consequently results in a smoother silicon surface after the clean has been conducted.

Accordingly, the present invention comprises a method for dry cleaning the silicon surface located on an in-process integrated circuit wafer which comprises the following steps. First, a silicon surface is provided on a surface of a silicon wafer. The silicon surface typically comprises silicon, doped silicon, polysilicon, aluminum, or other materials which in the course of the integrated circuit manufacturing process must be cleaned.

In a further step, a procedure is conducted on the surface of the silicon surface which necessitates the cleaning procedure. This typically comprises etching the surface or stripping the surface of a photoresist material or a native or sacrificial oxide layer. In the course of these processes, contaminates are left behind on the surface of the silicon surface. The contaminates typically comprise oxide residue, trace metal contaminates, or organic materials such as hydrocarbon contaminates.

The next step comprises locating the wafer in a suitable reaction chamber. As used herein, the term reaction chamber means any vessel or chamber within which a cleaning or etching process can be conducted. The reaction chamber preferably comprises a module of a cluster tool within which the silicon wafer was etched or an oxide layer was removed. The reaction chamber can also comprise a separate process chamber, including a process chamber within which the wafer is etched. Examples of such a reaction chamber are the Primax model available from Sub Micro Systems of Allentown, Pa., USA.

The next step under the present invention is to adhere an adsorbent layer, hereafter referred to as "the surface diffusion layer" to the silicon surface. The surface diffusion layer can comprise any material which inhibits direct reaction of the gas phase cleaning agent with the silicon surface. Preferably, the surface diffusion layer comprises water or solvent in the liquid state. The surface diffusion layer is adhered in any manner or process by which a surface diffusion layer is adsorbed on the silicon surface. Preferably, the surface diffusion layer is adhered in a process comprising first, heating the water or solvent to generate the vapor, then bubbling an inert gas such as N$_2$ or Ar through the water or solvent, and finally, introducing the water or solvent vapor into the chamber.

A further step to be conducted is the actual cleaning of the silicon surface while the surface diffusion layer is adhered to the silicon surface. This is preferably conducted in the same reaction chamber wherein the etch or oxide removal or other prior process as well as the surface diffusion layer adhesion process was conducted in. A dry cleaning process which uses ultraviolet radiation, such as the photo-enhanced dry cleaning process described above, is typically used to conduct the cleaning step. Under such a dry cleaning process, the film surface is exposed to ultraviolet radiation in an atmosphere containing a cleaning agent. This can be conducted in multiple steps using different cleaning agents in each step, the agents being effective to clean specific different surfaces. For example, an atmosphere of O$_3$ has been found to effectively remove hydrocarbon contaminates, and an atmosphere of Cl$_2$ has been found to effectively remove trace metal contaminates.

The surface diffusion layer greatly increases the density of particles through which the cleaning agent must pass, thus decreasing the mean free path. This results in a smooth silicon surface with less pitting and scoring.

The silicon surface is then ready for further process steps in the integrated circuit manufacturing process. As an example of a further process step conducted immediately after the cleaning, a gate oxide is often formed immediately after the dry cleaning process. The surface will be properly prepared for such a process step, in that the silicon surface will be clean, dry, particle free, and damage free as a result of the inventive method. Any further layer, including the gate oxide layer, will adhere better with less incidence of surface breakdown. Accordingly, device performance improves and yield is increased.

Thus, the present invention provides a method whereby a dry cleaning process may be conducted within the same cluster tool or etching chamber as a previous etch or oxide removal was conducted, in order to prepare the silicon surface for further procedures. The silicon surface will, as a result, be effectively cleaned and will exhibit less roughness than the silicon surface would if the silicon surface was cleaned with conventional methods.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for cleaning a silicon surface comprising:
   locating the silicon surface in a reaction chamber;
   forming a liquid surface diffusion layer on the silicon surface;
   forming an atmosphere of a gaseous chlorine in the reaction chamber;
   exposing said atmosphere of said gaseous chlorine to ultraviolet light so as to form therefrom gaseous radicals of chlorine;
   conducting a cleaning process on the silicon surface while the liquid surface diffusion layer is on the silicon surface by diffusing said gaseous radicals of chlorine through the surface diffusion layer.

2. A method as recited in claim 1, wherein said gaseous radicals of chlorine react with a metal particulate matter on the silicon surface.

3. A method as recited in claim 1, wherein the cleaning process is conducted at substantially atmospheric pressure.

4. A method as recited in claim 1, further comprising removing the liquid surface diffusion layer.

5. A method as recited in claim 1, wherein said gaseous radicals of chlorine react with a trace metale contaminate on the silicon surfacea and are used to remove said trace metal contaminante.

6. A method as recited in claim 1, wherein diffusing said gaseous radicals of chlorine through the surface diffusion layer reduces the mean free path thereof.

7. A method as recited in claim 1, wherein a continuous film is removed from the silicon surface in the reaction chamber so as to render said silicon surface substantially unoxidized and having thereon particles of inorganic matter previous to forming the liquid surface diffusion layer on the silicon surface.

8. A method as recited in claim 7, wherein the continuous film is etched within the reaction chamber previous to forming the liquid surface diffusion layer on the silicon surface.

9. A method as recited in claim 1, wherein said silicon surface is substantially unoxidized and is substantially composed of a material selected from a group consisting of substantially undoped monocrystalline silicon doped monocrystalline silicon, and polysilicon.

10. A method for cleaning a silicon surface comprising:
    forming a liquid layer on a substantially unoxidized bare silicon surface having thereon particles of inorganic matter;
    forming an atmosphere of gaseous chlorine proximal to said silicon surface;
    exposing said atmosphere of gaseous chlorine to ultraviolet light so as to form therefrom gaseous radicals of chlorine, wherein said gaseous radicals of chlorine diffuse through said the liquid layer, and wherein said gaseous radicals of chlorine react with said inorganic matter; and
    removing said liquid layer with said reacted inorganic matter from said substantially unoxidized bare silicon surface.

11. The method as defined in claim 10, wherein said substantially unoxidized bare silicon surface is substantially composed of a material selected from a group consisting of substantially undoped monocrystalline silicon, doped monocrystalline silicon, and polysilicon.

12. The method as defined in claim 10, wherein diffusing said gaseous radicals of chlorine through the liquid layer reduces the mean free path thereof.

13. The method as defined in claim 10, wherein the liquid layer is substantially composed of water.

14. A method for cleaning a silicon surface comprising:
    forming a layer substantially composed of water on a substantially unoxidized bare silicon surface having thereon particles of inorganic matter, wherein said substantially unoxidized bare silicon surface is substantially composed of a material selected from a group consisting of substantially undoped monocrystalline silicon, doped monocrystalline silicon, and polysilicon;
    diffusing gaseous radicals of a halogen through the layer of water so as to reduce the mean free path thereof by:
      forming an atmosphere of gaseous chlorine proximal to said silicon surface; and
      exposing said atmosphere of gaseous chlorine to ultraviolet light so as to form therefrom gaseous radicals of chlorine, wherein said gaseous radicals of chlorine diffuse through said the liquid layer substantially composed of water, and wherein said gaseous radicals of chlorine react with said inorganic matter; and
    removing said layer substantially composed of water with said reacted inorganic matter from said substantially unoxidized bare silicon surface.

15. A method for cleaning a silicon surface comprising:
    forming a liquid layer of a solvent on a substantially unoxidized bare silicon surface having thereon particles of inorganic matter;
    forming an atmosphere of a gaseous chlorine proximal to said silicon surface;
    exposing said atmosphere of said gaseous chlorine to ultraviolet light so as to form therefrom gaseous radicals of chlorine, wherein said gaseous radicals of chloine diffuse through said the liquid layer, and wherein said gaseous radicals of chloine react with said inorganic matter.

16. The method as defined in claim 15, wherein diffusing said gaseous radicals of chlorine through the liquid layer of the solvent reduces the mean free path thereof.

17. The method as defined in claim 15, wherein said substantially unoxidized bare silicon surface is substantially composed of a material selected from a group consisting of substantially undoped monocrystalline silicon, doped monocrystalline silicon, and polysilicon.

* * * * *

UNITED STATES PATENT AND TRADEMARK OFFICE
CERTIFICATE OF CORRECTION

PATENT NO. : 5,749,975
DATED : May 12, 1998
INVENTOR(S) : Li Li; Richard C. Hawthorne It is certified that error appears in the above-identified patent and that said Letters Patent is hereby corrected as shown below:

Col. 2, line 15, after "184.9" change "nanometer" to --nanometers--

Col. 5, line 47, after "trace" change "metale" to --metal--

Col. 5, line 48, after "silicon" change "surfacea" to --surface--

Col. 5, line 49, change "contaminante" to --contaminate--

Col. 5, line 66, after "silicon" insert a comma

Col. 6, line 10, after "said" delete --the--

Col. 6, line 40, after "said" delete --the--

Col. 6, line 55, after "said" delete --the--

Signed and Sealed this

Thirtieth Day of March, 1999

Attest:

Attesting Officer

Q. TODD DICKINSON

Acting Commissioner of Patents and Trademarks